United States Patent [19]

Kerwin et al.

[11] 3,891,984

[45] June 24, 1975

[54] ANALOG TO DIGITAL CONVERSION BY SUBRANGING WITH MULTIPLE LEVEL REDUNDANT ERROR CORRECTION

[75] Inventors: Robert D. Kerwin, Orange; Darwin B. Sulzle, Placentia, both of Calif.

[73] Assignee: The United States of America as represented by the Secretary of the Air Force, Washington, D.C.

[22] Filed: Mar. 7, 1973

[21] Appl. No.: 338,727

[52] U.S. Cl. .. 340/347 CC; 324/99 D; 340/347 AD

[51] Int. Cl. .......... H03k 13/02

[58] Field of Search .......... 340/347 AD, 347 CC; 324/99 D

[56] References Cited

UNITED STATES PATENTS 3,298,014 1/1967 Stephenson .......... 340/347 AD 3,483,550 12/1969 Max .......... 340/347 AD

OTHER PUBLICATIONS

Hoeschele, "Analog-to-Digital/Digital-to-Analog Conversion Techniques," 8/1968, J. Wiley & Sons, pp. 413–415.

*Primary Examiner*—Thomas J. Sloyan
*Attorney, Agent, or Firm*—William Stepanishen

[57] ABSTRACT

An analog to digital converter apparatus utilizing subranging with multiple level redundant error correction to increase the speed of conversion. The multiple level correction technique provides a more rapid acquisition of the subrange word.

2 Claims, 4 Drawing Figures

PATENTED JUN 24 1975 3,891,984

SHEET 1

ANALOG TO DIGITAL CONVERSION BY SUBRANGING WITH MULTIPLE LEVEL REDUNDANT ERROR CORRECTION

BACKGROUND OF THE INVENTION

The present invention relates broadly to an analog to digital converter apparatus and in particular to a subranging analog to digital converter with multiple level redundant error correction.

In the prior art various techniques and schemes have been utilized to increase the speed of analog to digital converters. Analog to digital converter can usually be classified into groups. One group includes high speed parallel converters in which the several digital bits are formed more or less simultaneously. The high speed of operation is obtained here at significant expenditures. The converters of the second group operate by successive approximation; progressively synthesized analog equivalents of progressively formed digital signals are compared individually with the analog information signal.

A digital correction scheme which is known in the prior art as single level correction, has been used with a subranging converter of three or more subrange stages. This technique is used to overcome the basic limitations in the comparator threshold accuracies and the interim D/A amplifier settling times. Single level correction will approximately double the operating speed of an equivalent converter that doesn't utilize the technique. A marked improvement in the speed of analog to digital converter is achieved by the present invention with multiple level correction as compared with the single level correction technique.

SUMMARY

The present invention utilizes an analog to digital converter which comprises a four stage block of multi-element comparators using a level correction technique to achieve full stage subranging of multilevel inputs. A complete 11 bit word is generated by combining the output of the four stages. The first section generates a 3 bit word, the second section generates the next 3 bits, the third section generates the next 3 bits, and the fourth section generates the last 2 bits. Synchronization of the outputs of the four comparator sections provides time alinement in a final output register thus creating the complete 11 bit word.

It is one object of the invention, therefore, to provide an improved analog to digital converter apparatus utilizing a four stage subranging converter with multiple level error correction.

It is another object of the invention to provide an improved analog to digital converter apparatus having a substantially more rapid acquisition of the subrange words, thus increasing the speed of the overall conversion.

These and other advantages, features and objects of the invention will become more apparent from the following description taken in connection with the illustrative embodiment in the accompanying drawings.

DESCRIPTION OF THE PREFERRED EMBODIMENT

Figure 1:
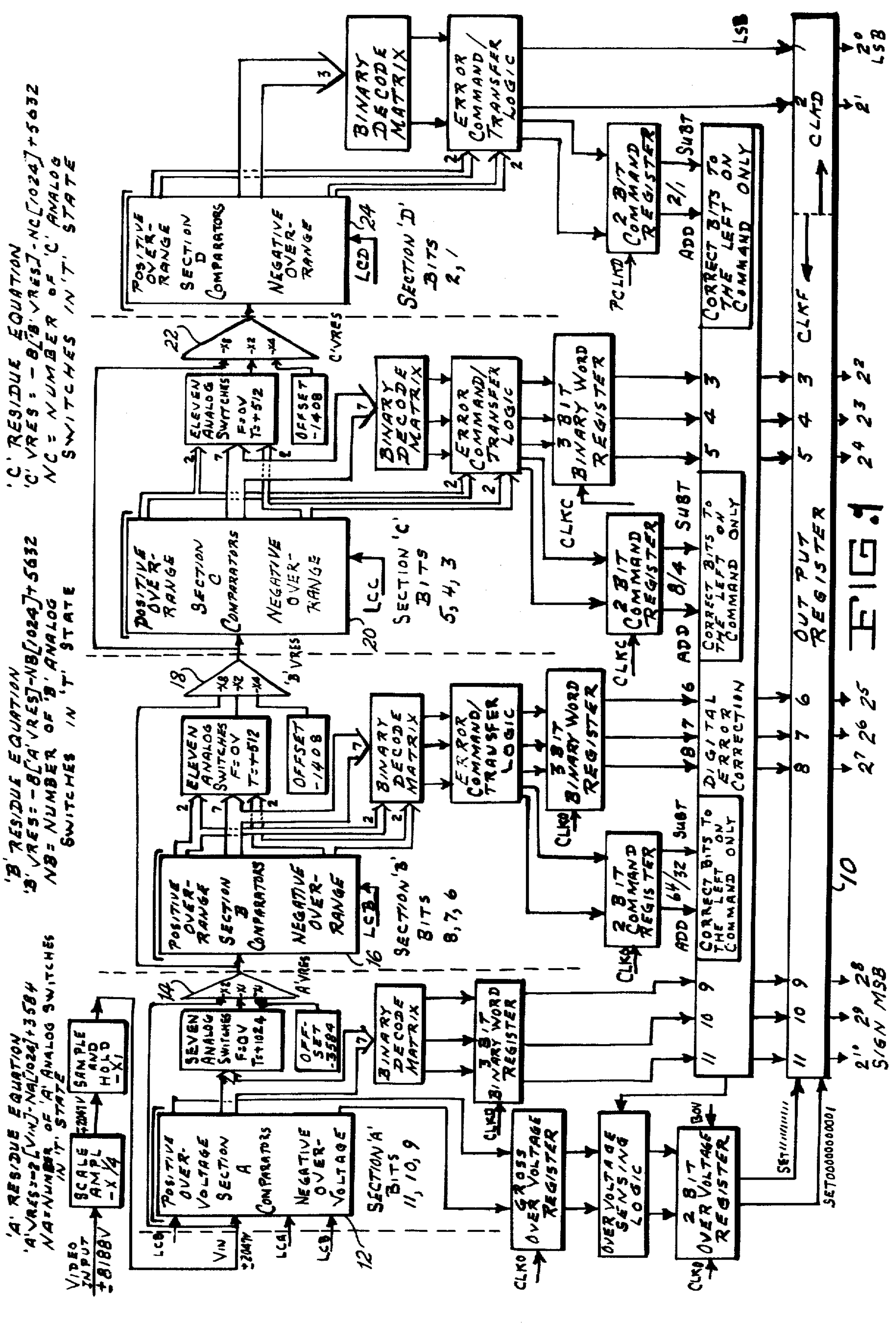
FIG. 1 is a block diagram of the analog to digital converter apparatus in accordance with this invention.

Referring now to FIG. 1, there is shown an 11 bit, 2 MHz word rate converter apparatus utilizing subranging with digital error correction. The subranging mechanization for this converter generates the 11 bit word in four sections. The first section A generates a 3 bit word (SIGN, MSB, MSB–1). The second section B generates the next 3 bits. The third section C generates the next 3 bit word, and the fourth section D generates the last 2 bits (LSB +1, LSB). These groups of 3, 3, 3, and 2 bits are aligned in time in the final output register 10 creating the complete eleven bit word.

The conversion process is as follows: The input video which is scaled from ± 8.188 to ± 2.047 V, is sampled at the beginning of a 500 nsec range bin and is converted in the four stages A, B, C and D with a conversion time of approximately 125 nsecs per stage.

The first section A determines the word in the first 3 bits (SIGN, MSB, MSB–1) by dividing the dynamic range (± 2,047 mv) into eight equal segments with seven voltage comparators 12. The magnitude of a particular input signal is sensed by these comparators. Once the comparators 12 determine which segment contains the input signal, a voltage proportional to the lower bound of that segment is subtracted from the input signal in the section A residue amplifier 14.

The outputs of the comparators 12 are defined such that if the input voltage exceeds (more positive) the reference voltage of a comparator, the output of that comparator will be false. Once the input voltage has settled within accuracy limits (± 128 mv) determined by the self correction (redundancy) requirements, the outputs of the comparators 12 are latched. Once the section A outputs are latched, the A Vres equation will be used to determine the output voltage of section A Residue Amplifier 14.

$$A\ Vres = -2\ (Vin) - NA\ (1024) + 3584$$

where NA = the number of comparators switched in the true state, not counting AC0 or AC8 since they are used only for gross overvoltage sensing. The output of the Section A, Residue amplifier 14 is the input to the Section B Comparators 16 and Residue card 18.

The Section B Comparators 16 contains eleven comparators biased as shown in Table 1 shown below.

Table 1

| | |
|---|---|
| Ex 2 | |
| BC00 | + 640 mv |
| BC0 | + 512 mv |
| BC1 | + 384 mv |
| BC2 | + 256 mv |
| BC3 | + 128 mv |
| BC4 | O V |
| BC5 | − 128 mv |
| BC6 | − 256 mv |
| BC7 | − 384 mv |
| Ex 1 | |
| BC88 | − 512 mv |
| BC88 | − 640 mv |

The outputs of the comparators are defined as follows:

If the input voltage (A Vres) exceeds (more positive) the reference voltage, the output of that comparator will be false. Comparators BC00, BC0, BC8, and BC88 are the redundancy comparators. The redundancy comparators would not be necessary if it could be guaranteed that the decision made by the A Comparators 12 was correct. Since it is required that the input voltage settle to within ± 128 mv of the final value, an error is possible. If a section A comparator 12 is latched in an incorrect state, this error will be reflected in the output of the section A Residue amplifier 14. This error will be sensed by the section B redundancy comparators 16. If a redundancy comparator senses an error, it will generate a command to the digital correction circuitry which will correct the binary count that has been decoded from the section A comparators 12.

The output of section B Residue amplifier 18 is defined by: B Vres = 8 (A Vres) − NB (1024) + 5632 where NB = the number of comparator switches in the true state including BC0, BC00, BC8, and BC88.

Figure 2:
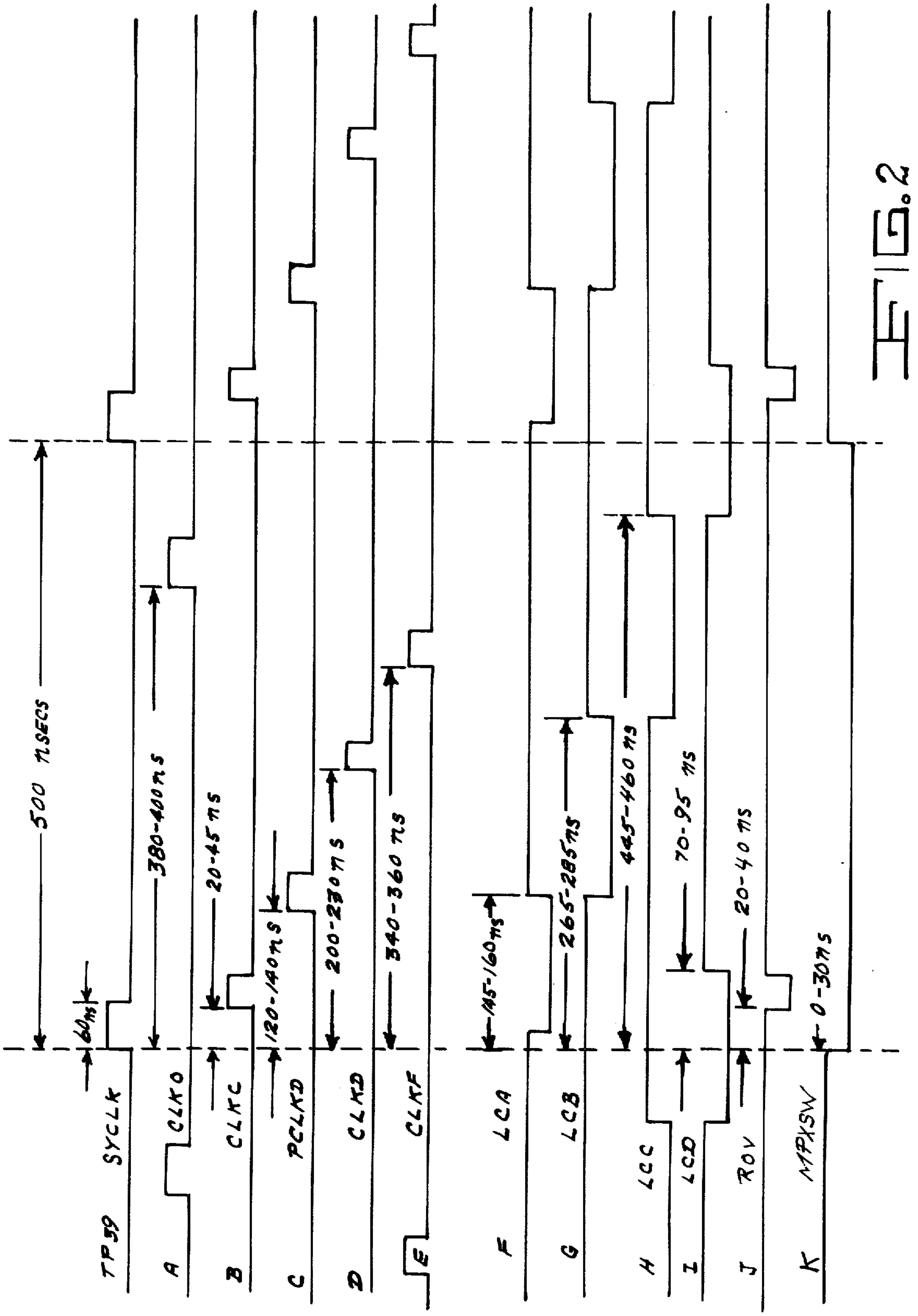
FIG. 2 is a timing diagram of signals generated within the analog to digital converter apparatus.

The operation of Section C Comparators 20 and Residue amplifier 22 is identical to the operation of section B comparators 16. The operation of the section D Comparators 24 is identical to sections B and C comparators. The timing diagram for the A/D converter shown in FIG. 1 is given in FIG. 2. The threshold voltages for the section A–D comparators 12, 16, 18, 24 is given by tables 2 through 4.

Table 2

| | | | |
|---|---|---|---|
| AC8 | | | + 2048 mv |
| | | Ex 2 | |
| AC7 | | | + 1536 mv |
| | Ex 1 | | |
| AC6 | | | + 1024 mv |
| AC5 | | | + 512 mv |
| AC4 | | | O V |
| AC3 | | | − 512 mv |
| AC2 | | | − 1024 mv |
| AC1 | | | − 1536 mv |
| AC0 | | | − 2048 mv |

Table 3

| | | | |
|---|---|---|---|
| CC88 | | | + 640 mv |
| | Ex 2 | | |
| CC8 | | | + 512 mv |
| CC7 | | | + 384 mv |
| CC6 | | | + 256 mv |
| CC5 | | | + 128 mv |
| CC4 | | | O V |
| CC3 | | | − 128 mv |
| CC2 | | | − 256 mv |
| CC1 | | | − 384 mv |
| | | Ex 1 | |
| CC0 | | | − 512 mv |
| CC00 | | | − 640 mv |

Table 4

| | | | |
|---|---|---|---|
| DC00 | | | + 768 mv |
| DC0 | | | + 512 mv |
| DC2 | | | + 256 mv |
| DC4 | | | O V |
| | Ex 1 | Ex 2 | |
| DC6 | | | − 256 mv |
| DC8 | | | − 512 mv |
| DC88 | | | − 768 mv |

The following are the rules for digital correction:

Subt 2 command: Set the decoded binary output to 110 and subtract 1 from the previous stages.

Subt 1 command: Set the decoded binary output to 111 and subtract 1 from the previous stages.

Add 1 command: Set the decoded binary output to 000 and add 1 to the previous stages.

Add 2 command: Set the decoded binary output to 001 and add 1 to the previous stages.

Analog Conditions for Correct Operation Reflecting the errors back to the input, Vin must settle to within ± 128 mv before AC0–AC8 may be latched.

Vin must settle to within ± 16 mv before BC00–BC88 may be latched.

Vin must settle to within ± 4 mv before CC00–CC88 may be latched.

Vin must settle to within ± 1.0 mv before DC00 – DC88 may be latched.

The following two examples will be shown to demonstrate the operation of the converter. Example 1 will assume an ideal input voltage which is showing FIG. 3. Example 2 will assume an input that varies with time (shown in FIG. 4) causing errors to be made during the conversion. The second example will demonstrate the Redundancy correction process.

EXAMPLE 1

Input Vin = +1,476 mv.

The desired output word will equal in magnitude [1,476 mv/2 mv (LSB) ] = 738

S
I
G
N
1 1011100010

Figure 3:
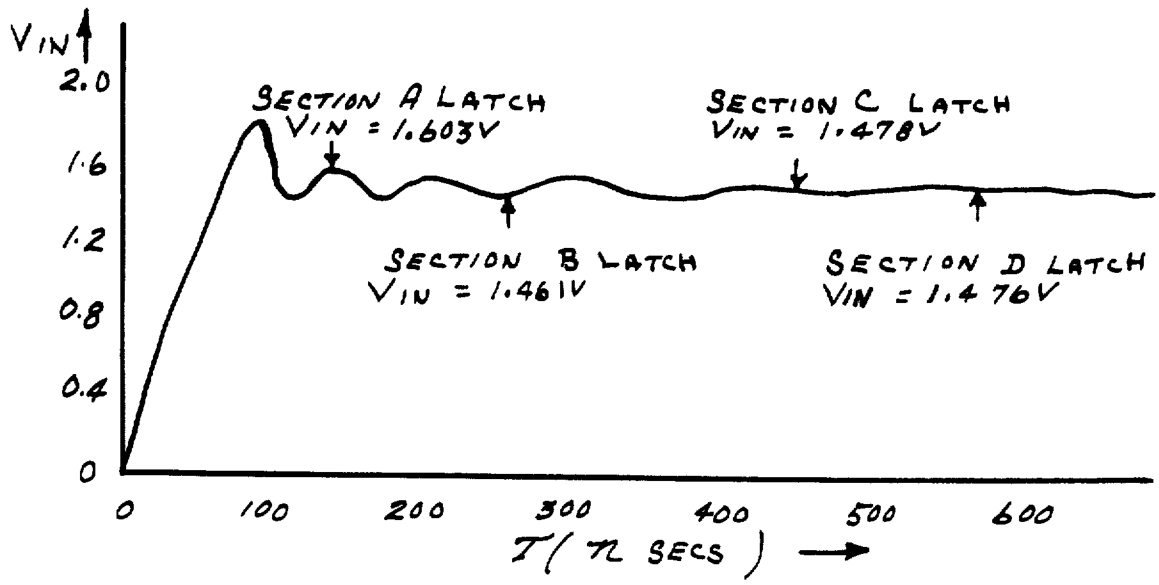
FIG. 3 is a graphic representation of an ideal input voltage to the converter apparatus versus time.

Vin to Comparators A and Residue Amplifier A card equals 1,476 mv. The + 1 mv offset is added in the sample and hold card and is required to center the voltage between comparator states and give a symmetrical dynamic range. The values of Vin are shown in FIG. 3.

Table 2 above shows comparators AC0–AC6 False and AC7–AC8 True, NA = 1. This condition decodes to the binary word 110.

Section A

| Data | Correction Command |
|---|---|
| 110 | No Overvoltage Condition |

AVres = −2 (1476 + 1) −1 (1024) + 3584
= −2954 − 1024 + 3584
AVres = −394 mv

Table 1 above shows Comparators BC88 – BC 8 False, BC7 – BC00 True. NB = 9. This condition decodes to the binary word 111.

Section B

| Data | Correction Command |
|---|---|
| 111 | No Correction |

BVres = −8 (−394) − 9 (1024) + 5632
= +3152 − 9216 + 5632
BVres = −432 mv

Table 3 above shows Comparators CC00 – CC0 False. CC1 – CC88 True. NC = 9. This condition decodes to the binary word 000.

Section C

| Data | Correction Command |
|---|---|
| 000 | No Corrections |

CVres = −8 (−432) − 9 (1024) + 5632
= +3456 −9216 + 5632
CVres = −128 mv

Table 4 above shows Comparators DC88 – DC6 False. DC4–DC00 True.

Section D

| Data | Correction Command |
|---|---|
| 10 | No Correction |

| Summary of Output Conditions | | | |
|---|---|---|---|
| Section A | Section B | Section C | Section D |
| 110 No Over-Voltage | 111 No Correction | 000 No Correction | 10 No Correction |

Final Output Word

S
I
G
N
1 1011100010 = 738 as required

The Example 1 demonstrates the operation of the converter assuming an idealized video input. Example 2 will be more realistic in that the amplitude of Vin will be changing with time. This will necessitate a recalculation of the residue amplifier outputs each time a comparison is made.

Figure 4:
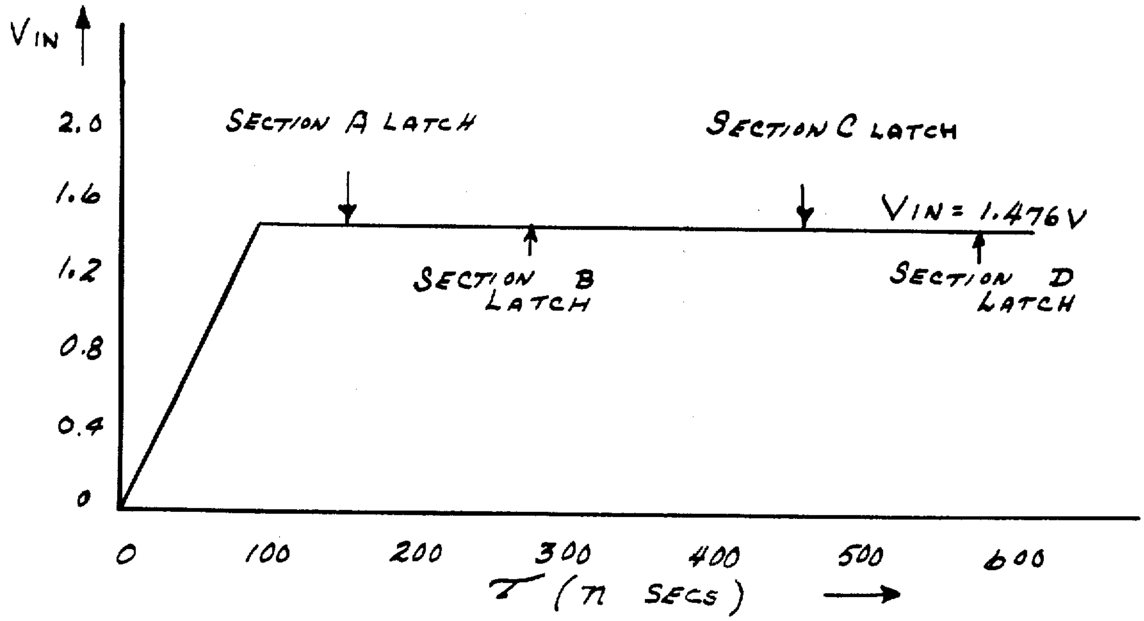
FIG. 4 is a graphic representation of an input voltage to the converter apparatus that varies with time.

For value of Vin shown in FIG. 4, Table 2 shows Comparators AC0 – AC7 False, AC8 True. NA = 0. This condition decodes to the binary word 111. Note: The decoded word is in error by 1 bit.

Section A

| Data | Correction Command |
|---|---|
| 111 | No Overvoltage Condition |

Using the value of Vin at 'B' comparators, Latch Time
AVres = −2 (1,461 + 1) − (1,024) + 3,584
AVres = −2,924 + 3,584
AVres = +660 mv Table 1 above shows Comparators BC88 – BC00 False. No comparators in the True state. NB = 0. This condition generates a subtract 2 command. As described in "Rules for Digital Correction," this condition will force the decoded word to 110 and generate a subtract 1 command to Section A.

Section B

| Data | Correction Command |
|---|---|
| 110 | Subtract 1 from Section A |

Using the value of Vin at 'C' comparators latch time, AVres is recalculated to solve for BVres.
AVres = −2 (1,478 + 1) −0 (1,024) + 3,584
AVres = −2,958 + 3,584
AVres = +626 mv
BVres = −8 (+626) − 0 (1,024) + 5,632
BVres = −5,008 + 5,632
BVres = +624 mv Table 3 above shows Comparators CC00 – CC8 False. CC88, True. NC = 1. This condition generates an Add 1 command. As described in "Rules for Digital Correction," this condition will force the decoded word to 000 and generate an Add 1 command to Section B.

Section C

| Data | Correction Command |
|---|---|
| 000 | Add 1 to Section B |

Using the value of Vin at 'D' comparators latch time, AVres and BVres are recalculated to solve for CVres.
AVres = −2 (1,476 + 1) −0 (1,024) + 3,584
AVres = +630
BVres = −8 (630) − 0 (1,024) + 5,632
BVres = +592
CVres = −8(592) − 1 (1,024) + 5,632
CVres = −4,736 −1024 +5,632
CVres = −128 mv Table 4 above shows Comparators DC88 – DC6 False. DC4–DC00, True.

Section D

| Data | Correction Commands |
|---|---|
| 10 | No Correction |

| Summary of Output Conditions | | | |
|---|---|---|---|
| Section A | Section B | Section C | Section D |
| 111 No Overvoltage | 110 Subtract 1 from A | 000 Add 1 to B | 10 No Correction |
| Final Output Word | | | |
| 110 | 111 | 000 | 10 |

The final output word agrees with the idealized output for Example 1. This example demonstrates how the redundancy information is used.

The various elements and devices which comprise the present invention are available from the following source. For example, the comparator A and its associated binary decode matrix are available as a unit under part number 1599271 from Hughes Aircraft Corp., Fullerton, Calif. 92634. The section B and C comparators respectively and their associated binary decode matrix are available under part number 1599272 from Hughes Aircraft Corp., Fullerton, Calif. 92634. The section D comparator and its binary decode matrix is available under part number 1599273. The following components are also available from Hughes Aircraft Corp., Fullerton, Calif. 92634 under the following part numbers as specified, for example; the residue A unit comprising the seven analog switches, the offset — 3584, and the A residue amplifier under part number 1599275; the residue B unit and residue C unit both respectively comprising 11 analog switches, the offset — 1408 and the B and C residue amplifier respectively under part number 1599276; the digital correction unit comprising the error command transfer logic, the binary word registers, the command registers, the digital error correction, and the output register under part number 1599279; the scale amplifier has part number 1599281; and the sample in hold has part number 1599278. All of the above components are available under the given part numbers from Hughes Aircraft Corp., Fullerton, Calif. 92634.

Although the invention has been described with reference to a particular embodiment, it will be understood to those skilled in the art that the invention is capable of a variety of alternative embodiments within the spirit and scope of the appended claims.

We claim:

1. An analog to digital converter apparatus with digital error correction comprising in combination:

an analog to digital converter having four stages to generate an 11 bit word, said analog to digital converter receiving an input voltage signal, said first state generating a 3 bit word, said second and third stages each generating a 3 bit word, said fourth stage generating a 2 bit word, said analog to digital converter providing an output binary count, said second, third and fourth stages including a plurality of redundancy comparators, (said plurality of redundancy comparators respectively checking the output of the previous stages) said plurality of redundancy comparators respectively generating a correction command for the affected stage upon sensing an error therein, a plurality of decode logic units respectively connected to said four stages of said analog to digital converter to receive the respective word bit, said plurality of decode logic units respectively decoding said output binary count, said plurality of decode logic units providing a binary word output, said plurality of decode logic units respectively including error command logic units connected respectively to said plurality of redundancy comparators of said second, third and fourth stages of said analog to digital converter, said error command logic units respectively providing an error correction signal upon receipt of said correct command from one of said plurality of redundancy comparators, an interim holding register connected to said plurality of decode logic units to store said binary word output, a digital error correction unit connected to said interim holding register to receive said binary word output, said digital error correction unit receiving error correction signals from said plurality of decode logic units, said error correction signals being utilized by said digital error correction unit to correct said binary word output, and an output register connected to said digital error correction unit to receive said binary word output, said output register aligning said binary word output in time, said output register providing a final 11 bit output word.

2. An analog to digital converter apparatus as described in claim 1 wherein said first stage of said analog to digital converter comprises:

seven voltage comparators to determine the first segment of said 11 bit word, said first segment being applied to a first residue amplifier, said first residue amplifier subtracting a voltage proportional to the lower bound of said first segment from said input voltage signal, said first residue amplifier providing a first output voltage, said second stage of said analog to digital converter comprising eleven voltage comparators to determine the second segment of said 11 bit binary word, said second stage receiving said first output voltage, said second segment being applied to a second residue amplifier, said second residue amplifier receiving said first output voltage, said second residue amplifier providing a second output voltage, said third stage of said analog to digital converter comprising eleven voltage comparators to determine the third segment of said eleven bit binary word, said third stage receiving said second output voltage, said third segment being applied to a third residue amplifier, said third residue amplifier receiving said second output voltage, said third residue amplifier providing a third output voltage, and said fourth stage of said analog to digital converter comprising seven voltage comparators to determine the fourth segment of said 11 bit binary word, said fourth stage receiving said third output voltage, said fourth stage generating a 2 word bit output.

* * * * *